United States Patent [19]

Souloumiac

[11] Patent Number: 4,868,568
[45] Date of Patent: Sep. 19, 1989

[54] MIRROR OPTICAL KEYBOARDS

[76] Inventor: Alain Souloumiac, 29 rue du General Brunet, 75019 Paris, France

[21] Appl. No.: 138,091
[22] PCT Filed: Mar. 19, 1987
[86] PCT No.: PCT/FR87/00082
§ 371 Date: Nov. 18, 1987
§ 102(e) Date: Nov. 18, 1987
[87] PCT Pub. No.: WO87/05759
PCT Pub. Date: Sep. 24, 1987

[30] Foreign Application Priority Data

Mar. 19, 1986 [FR] France ................. 86 03883

[51] Int. Cl.$^4$ ................. H03M 11/00; H03K 17/968
[52] U.S. Cl. ......................................... 341/31; 341/32; 250/221
[58] Field of Search ............ 340/365 P, 365 L, 712, 340/825.79; 250/229, 221, 230; 341/31, 32, 22, 26

[56] References Cited

U.S. PATENT DOCUMENTS

| | | | |
|---|---|---|---|
| 3,886,544 | 5/1975 | Narodny | 250/229 |
| 4,113,353 | 9/1978 | Matsushita | 350/171 |
| 4,379,968 | 4/1983 | Ely et al. | 340/365 P |
| 4,641,026 | 2/1987 | Garcia, Jr. | 250/229 |

OTHER PUBLICATIONS

"Opto-Magnetic Input Tablet or Keyboard" by S. C. Tseng, IBM Tech. Discl. Bulletin, vol. 22, No. 12, 5/80.

Primary Examiner—Donald J. Yusko
Assistant Examiner—Tyrone Queen
Attorney, Agent, or Firm—Steele, Gould & Fried

[57] ABSTRACT

A keyboard connectable to scanning means and constituted by an optical block comprising: a top face, a bottom face, and at least one edge interconnecting said faces; a plurality of light injection inlets (2) and a plurality of detection outlets (3) disposed so as to define optimum paths passing through said block between said top and bottom faces and establishing a logical matrix having intersections each of which associates one of said inlets and with one of said outlets; and reflectors (5) disposed at said intersections in order to couple the associated inlet/outlet paris; the keyboard being characterized in that said reflectors are fixed, in that said reflectors and the said optical paths going from the light injection inlets and arriving at said detection outlets are all at the same level; in that at least some of said optical paths cross one another physically at said level, and in that key-operatable shutters (4) are provided in order to allow, to limit, or to prevent at will the coupling established by each of said reflectors without obstructing the coupling established via other reflectors.

10 Claims, 5 Drawing Sheets

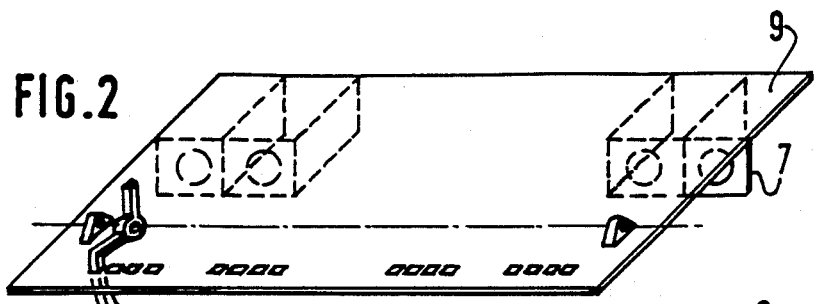
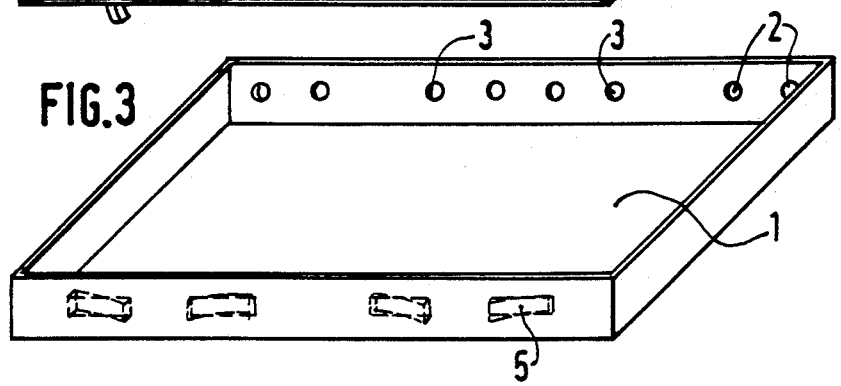
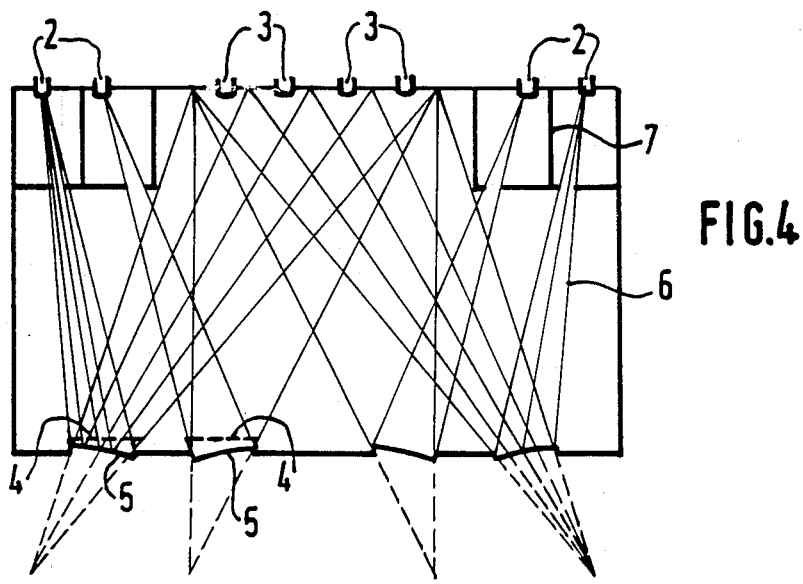

MIRROR OPTICAL KEYBOARDS

The present invention relates more particularly to scanning optical keyboards, i.e. to keyboards in which information is conveyed by light rays reflected on mirrors, and in which a number of optical components serves to handle a quantity of keys which is greater than would be possible using keys each fitted with individual detection and connection elements.

Because of the proliferation of microprocessors, scanning keyboards have become common on devices such as calculators, typewriters, word processor systems, computers, music synthesizers, vending machines, etc. Instead of using individually detected keys, i.e. keys each provided with their own particular connections to the system using them, the keys are connected in a logical matrix with a scanning interface which informs the system to which the keyboard is connected of the results of its inspections concerning the states of the keys. Each key is connected at an individual intersection in a matrix. It operates by producing two distinct states: a state in which the corresponding inlet and outlet are coupled and a second state in which they are not coupled.

In an optical keyboard, the signals used are visible light, or more generally any form of radiant energy (e.g. infrared or ultraviolet rays). These signals are applied to the keyboard inlets and its outlets are inspected to determine whether or not there is any coupling with the inlet signals. The coupling or noncoupling state at each intersection of the matrix is governed by an element which moves under the action of the corresponding key. This element is generally in the form of a shutter or of a moving mirror. In an electrical keyboard, coupling or noncoupling between electrically conductive materials is generally provided by on/off switches, but other components such as capacitive switches or Hall effect switches are also widespread.

A priori, optical keyboards offer considerable advantages over electrical keyboards. For example, they are free from electrical interference (both as emitters of interference and as receivers of interference). By their very nature, they offer improved safety (no sparks in explosive atmospheres), key bounce is reduced at source, component life is increased (no contact wear), .

The major problem with matrix optical keyboards lies in the frequently random results that may occur when two or more keys are depressed simultaneously. This problem arises during high speed typing: operators are capable of typing at speeds of more than 10 characters per second. As a result, several keys may be depressed simultaneously at any given moment. The person skilled in the art refers to this problem by the English term "key rollover": it is important for the user system to be able to identify keys reliably and the order in which they are depressed, even if several keys happen to be simultaneously depressed at any given moment. Further, even without high speed typing, many keyboards require a plurality of keys to be depressed simultaneously, for example the shift key and some other key in order to gain access to particular symbols or functions. This problem is thus quite general. Another problem, related to the first, is the problem of "ghost" keys: the depression of a key which the operator is not touching can be simulated by a combination of other keys, and the user system has no way of establishing which keys are really being depressed.

In an optical keyboard, the problem of reliably identifying any key even in the presence of a plurality of keys being depressed simultaneously, is solved provided it can be guaranteed firstly that every key has access to light regardless of the states of any other keys (coupling or noncoupling), and secondly that each photodetector can "see" all of the keys which are associated therewith, again regardless of the states of any other keys. This comes to saying that the optical path between each light source and each of the keys which are associated therewith must never be totally obstructed, and also that the optical path connecting each photodetector with each of the keys which are associated therewith must never be totally obstructed either. This fundamental condition is referred to herein as the "unobstructed optical path condition", and it should be understood that partial obstruction may be tolerable provided that enough light can still reach the worst-placed photodetector.

An early example of an optical keyboard is described in U.S. Pat. No. 3,056,030 (Kelcher). This document relates to a typewriter fitted with an optical keyboard. Rows and columns are not coupled or decoupled by the action of one or more keys, but instead the action of each key is to interrupt light simultaneously both on a row and on a column. This gives rise to a system in which any key situated downstream from a depressed key is deprived of light, in its row or column as the case may be.

A first keyboard which satisfies the unobstructed optical path condition is the keyboard shown in FIGS. 7 and 8 of U.S. Pat. No. 3,856,127 (Halfon), in which each of these unobstructed optical paths is individually constituted by an optical fiber. These fibers are collected together in row and column bundles and each bundle co-operates with a light source or with a photodetector which is associated therewith.

A second, which satisfies this condition is described in U.S. Pat. No. 4,311,990 (Burke) in which each light source operates over a relatively wide arc (about 100°) and each photodetector receives light over a similar angle. A trellis of light sources, of photodetectors, and of key-operated shutters is mounted in a light-proof box. Depending on the arrangement used, well-placed light sources and photodetectors co-operate with four keys each, while less well-placed devices operate with one or two keys only. In spite of the sharing of light sources and photodetectors which this arrangement makes possible, the maximum number of keys with which any light source or any photodetector can cover is limited, in practice, to four.

Another drawback inherent to this type of structure lies in the way in which the light sources and the photodetectors are disposed over the keyboard assembly at trellis crosspoints. In practice, this requires a printed circuit and thus electricity within the keyboard and as a result it means that one of the major advantages of an optical keyboard is lost, namely the absence of electrical interference (see above).

A third optical keyboard satisfying this unobstructed optical path condition is the keyboard shown in the patent U.S. Pat. No. 4,417,424 (Patterson), in which each light source shines into a first transparent plastic molding which constitutes a column transmission member, and in which each photodetector looks into a second transparent plastic molding which constitutes a row transmission member. The column transmission member is complex in shape, having five different lens-shaped outlets, each of which is preceded by a two-mirror periscope-type arrangement in order to bring the light downwards at an orthogonal angle. The row transmission members appear to be more regular, being in the form of rectilinear bars with facetes disposed at regular intervals to receive light via lenses which correspond to the above-mentioned output lenses. The overall result is a three-layer optical structure (column layer, lens layer, row layer) which is too thick for some applications and which leaves little flexibility in determining the locations of the keys.

The present invention provides a keyboard connectable to scanning means and constituted by an optical block comprising:

a top face, a bottom face, and at least one edge interconnecting said faces;

a plurality of light injection inlets and a plurality of detection outlets disposed so as to define optimum paths passing through said block between said top and bottom faces and establishing a logical matrix having intersections each of which associates one of said inlets and with one of said outlets; and reflectors disposed at said intersections in order to couple the associated inlet/outlet pairs;

the keyboard being characterized in that said reflectors are fixed, in that said reflectors and the said optical paths going from the light injection inlets and arriving at said detection outlets are all at the same level; in that at least some of said optical paths cross one another physically at said level, and in that key operable shutters are provided in order to allow, to limit, or to prevent at will the coupling established by each of said reflectors without obstructing the coupling established via other reflectors.

To simplify the description, the term "optical path" is used to designate any itinerary which light may take via various means from a source to a detector. These means include beam focusing in an appropriate medium and various types of optical duct such as an empty optical channel whose walls may be reflecting, or solid materials such as optical fibers made of transparent material. The radiant energy may follow deflections in various successive directions by virtue of deflector means such as mirrors, polished or chromium-plated metals, prisms, or any other device of this nature and referred to generally herein by the term "reflector". Secondary rays coming from a main light ray are referred to as "individual optical paths". These paths are generated both in columns and in rows. The term "row" designates a line running parallel to the long axis of the keyboard and the term "column" designates a line running across the keyboard. The light inlets and the detection outlets can usually be interchanged without making keyboard operation impossible.

Several embodiments of this optical block are described, by way of example, with reference to the accompanying drawings, in which:

FIG. 1 is a theoretical diagram applicable to the various blocks shown in the following figures and also to some prior art applications;

FIGS. 2, 3, and 4 give two views of an embodiment of a first optical block in which the light inlets and the detection outlets are to be found on the same edge;

Figure 1:
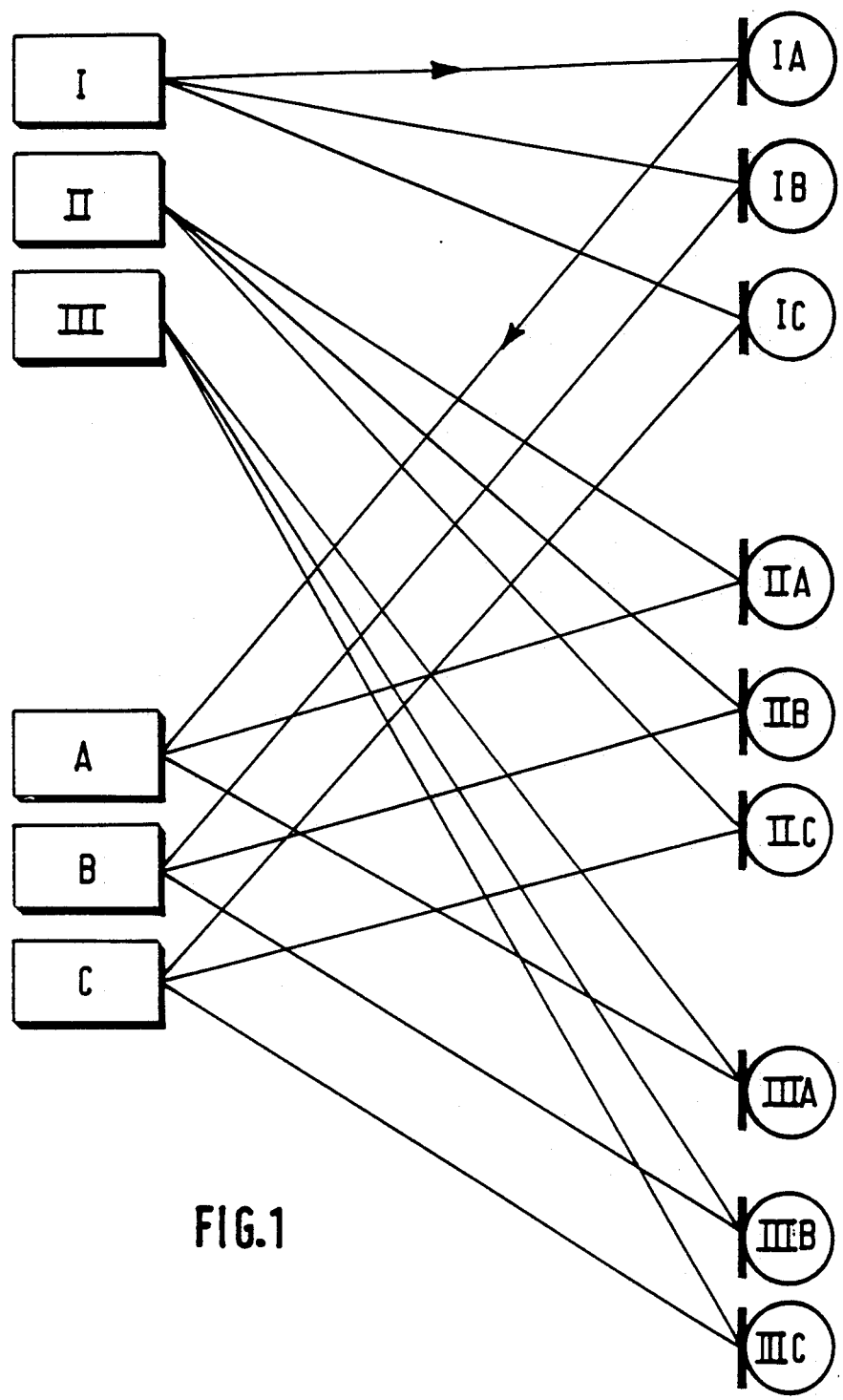

FIG. 1 is a diagram for explaining the principle on which the various embodiments of optical blocks shown in the following figures all operate. Light leaves a light source I which is switched on at time t and is reflected via three deflector I-A, I-B, and I-C towards three photodetectors A, B, and C. At time t+1, a light source II is switched on and deflectors II-A, II-B, and II-C are then brought into play. At time t+2, a light source III is switched on, and at time t+3 the system returns to the source I, and the same process continues cyclically. The action of each key is identified because its shutter modifies the coupling of that one of the nine pairs I-A to III-C which is attributed thereto.

In a first embodiment (FIGS. 2, 3, and 4), the optical block comprises a transparent box-shaped support 1, which may be rectangular, for example, hollow, and filled with air. Inside the block there are detection reflectors 5 distributed along one side and facing light inlets 2 and photodetectors 3 distributed along an opposite side. Keys are arranged to actuate shutters 4 (FIG. 4) by means of a mechanical force or a magnetic force in order to mask the access of the photodetectors 3 to the light which reaches them via the reflectors 5 from the light sources 2. The assembly is enclosed in an opaque box which may optionally include partitions 7 to prevent parasitic reflections from impeding the identification of the light sources by the photodetectors.

The light sources are powered by successive pulses. During each scan, one of the reflectors 5 (which are convex, see FIG. 3) is made use of to send light to all of the photodetectors. Each of the convex reflectors shown in FIG. 2 could alternatively be replaced by a series of suitably disposed individual reflectors. The shutters placed in front of the reflectors enable each of the keys to be identified even if several of them are depressed simultaneously.

Other dispositions could be provided. In order to increase the size of the beams, the detection reflectors 5 could be put on the same side as the other optical components, with a return reflector being installed on the opposite face. In this case, the light would follow a first go-and-return path across the support 1 from a source 2 passing via the return reflector and then reaching a detection reflector 5, followed by a second go-and-return path before reaching one of the detectors 3.

In addition to its qualities of reliability concerning combinations of depressed keys, the present disposition has the advantage of making it possible to obtain optimum beam apertures and of installing a plurality of lines of reflectors disposed in such a way that the lines closest the light emitting and detecting components do not obscure the others.

With the addition of an appropriate mechanism, such an identification block could be used for detecting key presses on a musical synthesizer. By using an old-fashioned typewriter type mechanism, it would be possible to make an alphanumeric keyboard without having multiple lines of reflectors.

This embodiment and variants thereof, and also the embodiments described below, show the utility of having reflectors which are fixed, given the orientation accuracy required. Light is thus interrupted by a shutter either before it reaches the reflector or after it has been reflected.

A second embodiment (FIGS. 5 and 6) is similar in principle to the preceding embodiment. It comprises a transparent box 1. In the example shown in FIG. 5, the optical block is hollow and rectangular. Two adjacent edges thereof are fitted respectively with light sources 2 and with detection elements 3. Optically insulating partitions 7 may optionally be fixed to the lid 9. Naturally, they could alternatively be fixed to the bottom portion 10 of the box.

Figure 8:
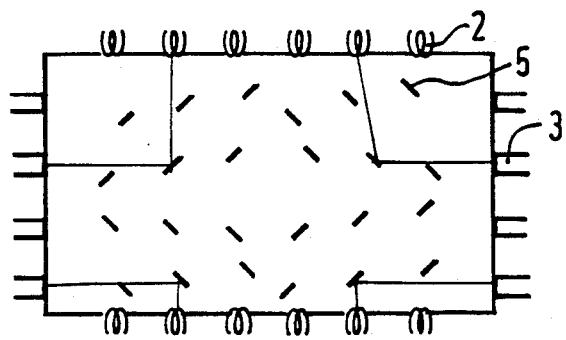
FIG. 8 shows a multi-matrix variant of the FIG. 6 embodiment.

It is also possible to fix emitting or receiving components on the third and even on the fourth side of the box. This would serve to reduce the distance between emitters and receivers and to increase the number of matrices available in a single optical block (see FIG. 8). This would serve to increase the detection capacity of the keyboard either for the purpose of making large-sized keyboards, or else for the purpose of making multi-matrix optical supports (which matrices may optionally be interleaved) common to various different configurations of key locations.

The fundamental difference between this second embodiment and the preceding embodiment lies in the fact that the reflectors are disposed inside the support at locations close to the intersections 5 of the rows coming from the sources 2 and the columns going to the detectors 3. The light is reflected from the rows towards the columns by means of small-sized reflectors 5 disposed in such a manner as to avoid obstructing one another. When a key 11 is depressed it causes one of the reflectors to be hidden by a shutter, or on the contrary to be revealed by a shutter.

The set of components placed on this block satisfies a rigorous disposition which serves to optimize its operation and its manufacture.

Naturally, this disposition is initially determined by the disposition of the keys on the final keyboard. However, given that the bottom support may be mass produced at relatively low cost—for example by molding it together with optional partitions and also with the reflectors which are subsequently coated with a reflecting layer—there is nothing to prevent the number of reflectors 5 being greater than the number which is strictly necessary, so that a single housing can receive a plurality of different key configurations. The optically insulating partitions 7 may be disposed to improve overall reliability.

The constraints related to key topology may be further reduced by making the optical block as independent as possible from the controlling key mechanism. The key rods are then no longer directly fixed to the shutters. Since the shutters are smaller than the section of the rods, it is possible to vary the locations of the rods over the shutters. This independence need not only be a once-and-for-all event during manufacture, but may be permanent in nature. In this case, it is advantageous for each shutter to be mechanically connected to the corresponding reflector. The shutters can then serve to wipe the reflector surfaces clean as they move—various solutions are possible, running from an arm hinged on the reflector to a moving sleeve.

These arrangements can also facilitate the installation of means on the keyboard for adjusting key stroke and key sensitivity by moving the key mechanism towards or away from the optical block. This independence of the optical block relative to the key mechanism facilities the adoption of sealing measures in order to protect the optical components from impurities or from humidity in the air and even from liquids.

Figure 7:
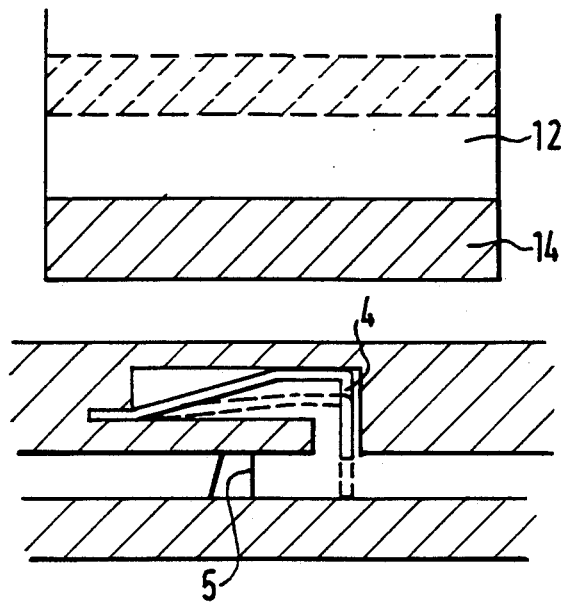
FIG. 7 is a section through a magnetically controlled shutter.

It is thus possible for the shutters to be controlled under the effect of a magnetic force along the lines shown in the example of FIG. 7. The end of the rod 12 of a key is magnetized, and when the key is depressed the end attracts the shutter 4 (position shown in solid lines in FIG. 7, with the rest position being shown in dashed lines), thereby uncovering the reflector 5. Alternatively rubber or deformable metal could be used for controlling the shutter, but in that case there would be a danger of the sealing not being so good.

The disposition of the optical components is determined by the aperture of the beam from the light source, the spacing between pairs of keys, the number of keys, and the width of the keys. The reflectors are spaced apart accordingly and are offset so as to avoid obstructing one another by casting unwanted shadows.

Figure 9:
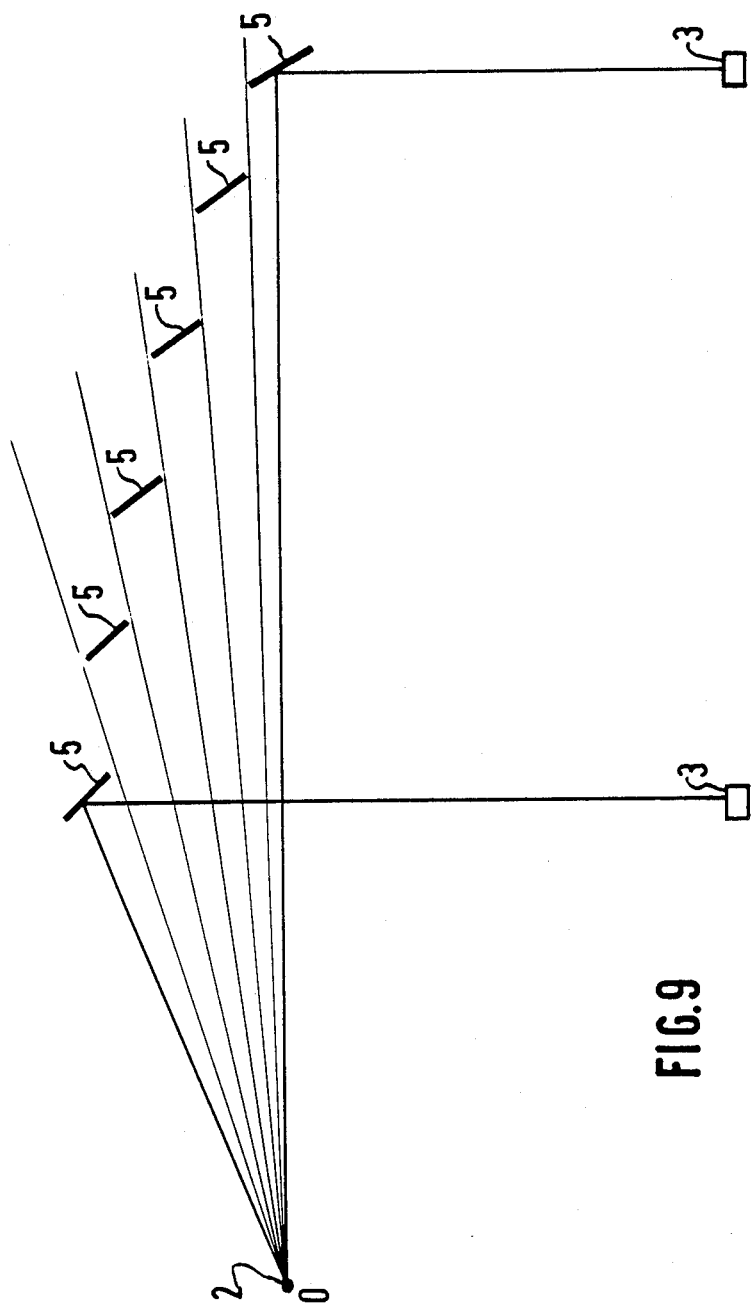
FIG. 9 is a theoretical diagram showing mirror location.

The offset is also intended to make fullest possible use of the beam by giving the light source a continuous surface to illuminate even if the reflectors are separate (see FIG. 9). It is advantageous to place the most distant reflector in the central region of the beam in order to benefit from the brightness maximum. Conversely, the reflectors closer to the emitter and therefore more strongly illuminated are advantageously disposed to the sides of the beam where light intensity is lower. Each of the reflectors is disposed at an angle for deflecting the beam coming from the light inlet towards a detection outlet. It is also possible to vary said angle and/or the sizes of the reflectors in order to even out the light intensity as received by the detectors.

Other means may be used, on their own or in combination with those already mentioned in order to even out the intensity of information relating to the various keys. These means may consist in varying receiver sensitivity or emitter intensity as a function of optical path length. Thus, if the emitters are disposed in columns, the lengths of the rows could be compensated for to a considerable extent by varying the levels at which the emitters emit light, with the column emitter furthest from the receivers providing the highest light intensity.

The locations and the sizes of the key-operated light path shutters are also determined. Each shutter should be located close to the corresponding reflector either shortly before or shortly after reflection on a section of light path which belongs to a given key only, so as to avoid obstructing the light paths belonging to the other keys.

Figure 5:
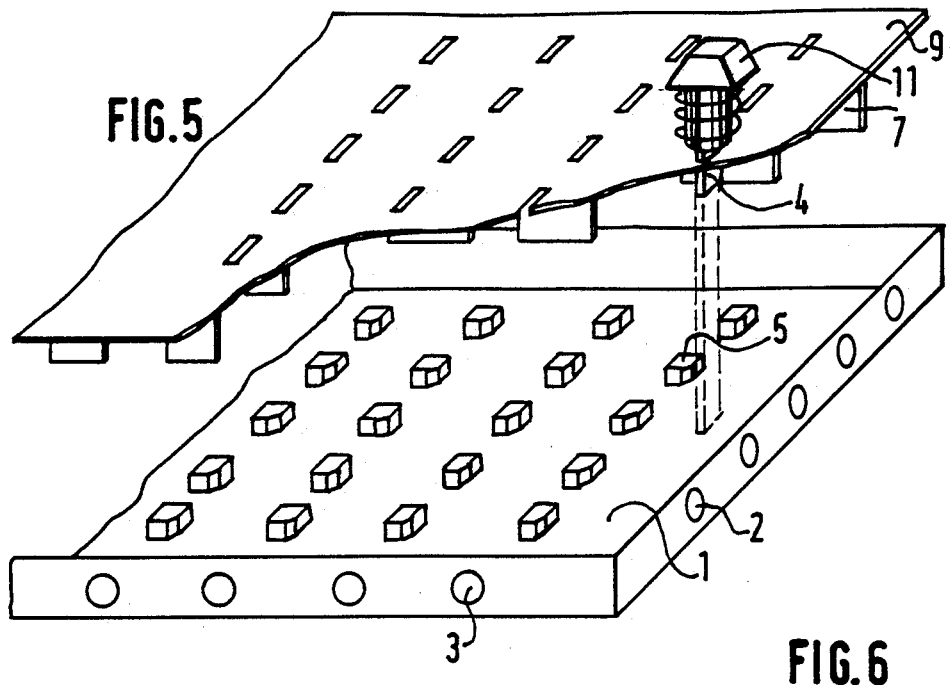
FIGS. 5 and 6 are two views of another embodiment in which the reflectors are located at the intersections of beams inside the optical block.
Figure 6:
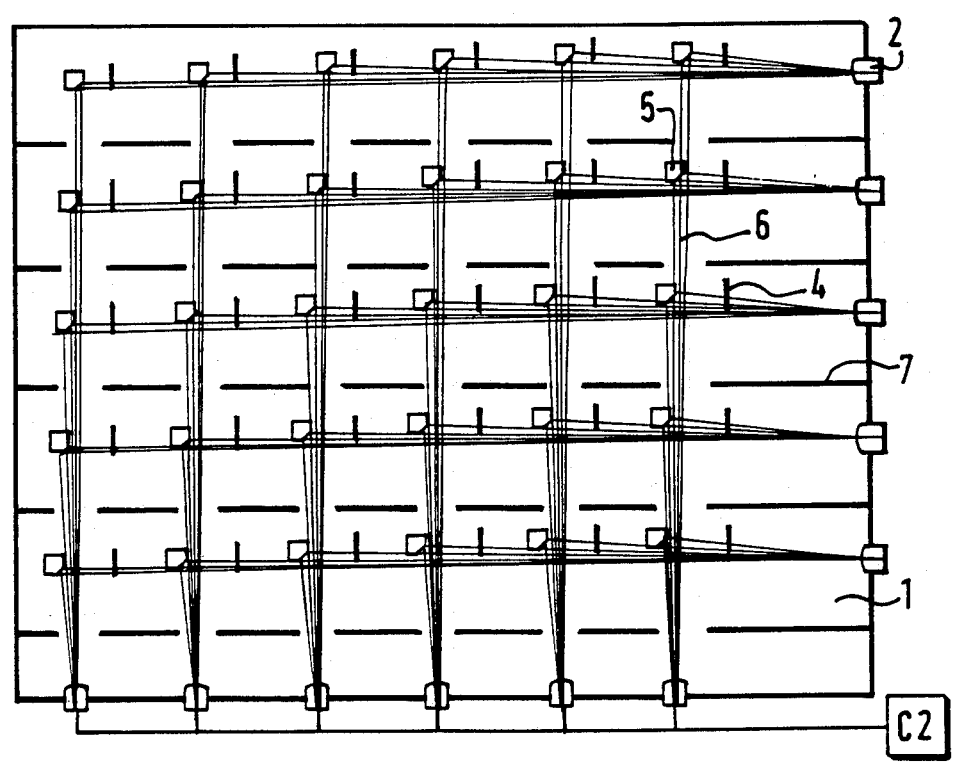

In the example shown in FIGS. 5 and 6, a beam of about 8° is used with key positions being at 2 cm spacing and with the reflectors 5 having a row width of about 1 mm. The reflector height in this case is 3 mm, since for reasons of simplicity the reflectors extend in two dimensions only.

The number of reflectors in a column is generally fairly small, and as a result there is a wider manoeuvring margin for fixing relative lateral dispositions so as to optimize the dispositions of the reflectors as the function of key locations. In this case, and generally, it is possible to provide reception lenses or cones in front of the detection outlets in order to converge light towards each detection outlet as much as possible.

In a variant of this second embodiment (not shown), it is possible, in order to facilitate connection with the scanning system which is connected to the optical support, to place all of the optoelectronic components along a single side of the optical block, as in the first above-described embodiment, by using additional mirrors or by using optical ducts such as optical fibers.

These embodiments make use of one of the characteristics specific to light, namely beams may cross in the same plane without interfering, whereas such crossovers would constitute short circuits in an electrical embodiment. Since each emitter/receiver pair and their associated detection reflectors are all located at the same level, many of the beams cross one another, but these beam crossings do not endanger proper operation of the keyboard. This organization contributes greatly to facilitating keyboard construction and to reducing its thickness.

I claim:

1. A keyboard suitable for use with keyboard scanning means including a plurality of switchable light sources and a plurality of light receivers, the keyboard being constituted by an optical block comprising:

a top face, a bottom face, and at least one edge interconnecting said faces;

a plurality of light injection inlets and a plurality of light detection outlets disposed so as to define optical paths passing through said block in between said top and bottom faces and establishing a logical matrix having intersections each of which associates one of said inlets and with one of said outlets;

reflectors disposed at said intersections in order to couple the associated inlet/outlet pairs, said reflectors being stationary relative to said block; and key-operable shutter means provided in association with each intersection in order selectively to vary the degree of the coupling established at the associated intersection;

wherein said reflectors and the said optical paths going from said light injection inlets and arriving at said light detection outlets all lie in a common place such that said optical paths intersect one another physically in said plane;

wherein each of said reflectors occupies a sufficiently small fraction of the corresponding intersection to ensure that each of the other reflectors can be illuminated from its associated light injection inlet and can be seen from its associated light detection outlet; and wherein each of said shutter means is dimensioned and disposed in such a manner as to ensure that there is no significant obstruction of coupling established via any of the other intersections, regardless of the effect of said shutter on the coupling established at its associated intersection.

2. A keyboard according to claim 1, wherein said inlets and outlets are substantially aligned along a common edge of the optical block.

3. A keyboard according to claim 1, including injection inlets and detection outlets placed along at least two edges of the optical block, wherein said reflectors inside said block are placed in an offset disposition suitable for building up a reflecting surface that appears to be continuous as seen from each inlet and form each outlet.

4. A keyboard according to claim 1, including light sources for emitting beams of light into the optical block, said light sources being such that the intensity of the light emitted thereby varies over a given arc, wherein, for each light source, the furthest of the associated reflectors is placed in the highest intensity zone of said arc, and the closest of the associated reflectors is placed in a low intensity zone thereof.

5. A keyboard according to claim 1, wherein the reflectors are physically disposed so as to tend to even out the levels of light intensity received at the detection outlets.

6. A keyboard according to claim 1, including light emitters and light receivers, wherein levels of at least one of receiver sensitivity and emitter power vary in such a manner as to even out levels of intensity in detection signals output by the receivers.

7. A keyboard according to claim 1, suitable for use with light sources which emit divergent light beams into the optical block, wherein converting devices are provided in order to compensate for divergence, at least partially, said converting devices being disposed at at least one of the following locations: at the injection inlets, at the reflectors, and at the detection outlets.

8. A keyboard according to claim 1, wherein the shutter means are mechanically coupled to the reflectors.

9. A keyboard according to claim 1, wherein the shutter means are controlled via magnetic forces by keys which operate outside the optical block.

10. A keyboard according to claim 1, wherein the injection inlets, the detection outlets, and the reflectors are disposed in such a manner as to constitute a plurality of matrices within the optical block.

* * * * *